US009083005B2

(12) United States Patent
Maindron

(10) Patent No.: US 9,083,005 B2
(45) Date of Patent: Jul. 14, 2015

(54) REACTOR FOR ATOMIC LAYER DEPOSITION (ALD), APPLICATION TO ENCAPSULATION OF AN OLED DEVICE BY DEPOSITION OF A TRANSPARENT Al2O3 FILM

(71) Applicant: COMMISSARIAT A L'ENERGIE ATOMIQUE ET AUX ENERGIES ALTERNATIVES, Paris (FR)

(72) Inventor: Tony Maindron, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/869,620

(22) Filed: Apr. 24, 2013

(65) Prior Publication Data
US 2013/0280833 A1   Oct. 24, 2013

(30) Foreign Application Priority Data
Apr. 24, 2012   (FR) ...................................... 12 53729

(51) Int. Cl.
| H01L 21/00 | (2006.01) |
| H01L 51/56 | (2006.01) |
| C23C 16/455 | (2006.01) |
| C23C 16/40 | (2006.01) |
| C23C 16/44 | (2006.01) |
| H01L 51/52 | (2006.01) |

(52) U.S. Cl.
CPC .............. *H01L 51/56* (2013.01); *C23C 16/403* (2013.01); *C23C 16/4401* (2013.01); *C23C 16/455* (2013.01); *C23C 16/45544* (2013.01); *C23C 16/45555* (2013.01); *C23C 16/45591* (2013.01); *H01L 51/5237* (2013.01)

(58) Field of Classification Search
CPC   H01L 51/56; C23C 16/455; C23C 16/45544; C23C 16/45555
USPC ......................................................... 118/715
See application file for complete search history.

(56) References Cited

U.S. PATENT DOCUMENTS

| 2003/0143319 A1 | 7/2003 | Park et al. ........................ 427/64 |
| 2009/0165713 A1* | 7/2009 | Kim et al. ...................... 118/719 |
| 2009/0255470 A1* | 10/2009 | Soininen et al. ............... 118/728 |
| 2009/0260569 A1* | 10/2009 | Kim et al. ...................... 118/715 |

FOREIGN PATENT DOCUMENTS

EP   2 161 352   3/2010

OTHER PUBLICATIONS

Preliminary Search Report and Written Opinion issued in French Application No. 1253729, dated Dec. 14, 2012.

* cited by examiner

*Primary Examiner* — Charles Garber
*Assistant Examiner* — Syed Gheyas
(74) *Attorney, Agent, or Firm* — Norton Rose Fulbright US LLP

(57) ABSTRACT

The present invention relates to a reactor for atomic layer deposition (ALD), comprising a reaction chamber comprising a platen and bounded internally by surfaces; at least one inlet orifice and at least one outlet orifice, each emerging from one of the surfaces bounding the chamber. The reactor furthermore comprises, within it, at least one wall apertured with at least one orifice, the apertured wall extending around the platen and over at least most of the height between the lower surface and the upper surface, at least one orifice in at least one of the apertured walls not facing the inlet orifice so as to form chicanes in the flow of gaseous precursor from each inlet orifice to the platen.

7 Claims, 2 Drawing Sheets

REACTOR FOR ATOMIC LAYER DEPOSITION (ALD), APPLICATION TO ENCAPSULATION OF AN OLED DEVICE BY DEPOSITION OF A TRANSPARENT Al2O3 FILM

BACKGROUND OF THE INVENTION

1. Technical Field

The present invention relates to a novel atomic layer deposition (ALD) reactor.

The present invention more particularly relates to a novel reactor architecture that allows the density of particles present in the reaction chamber to be considerably reduced.

The invention is advantageously used in the encapsulation of an organic light-emitting diode (OLED) via deposition of a transparent encapsulating film, such as a film of $Al_2O_3$.

2. Description of Related Art

At the present time OLED-containing devices are encapsulated in order to protect their sensitive components from gaseous species in the atmosphere (mainly oxygen and water vapour). This is because, if it is not suitably protected, there is a risk that the device will subsequently degrade, chiefly resulting in the appearance of non-emissive dark spots. These dark spots in fact result from the penetration of water vapour into the diode, thereby degrading the interface between the cathode or anode and the organic film(s).

For reasons of cost, and for certain applications, two types of chemical vapour deposition technique are, for the most part, currently used to deposit thin films on OLED devices. These thin films must have a barrier effect, thereby protecting the device from attack by external moisture. Generally, these thin barrier films are oxides, nitrides or oxynitrides, or, if required, thin metal films, the latter not being able to be used when the OLED(s) is(are) top-emitting devices, in which case the barrier films have to be transparent, necessarily.

The first type of technique is called PECVD (plasma enhanced chemical vapour deposition) in which gaseous reactants, also called gaseous precursors, are introduced simultaneously and react in the vapour phase (gas-phase nucleation), and with the surface of the substrate, thereby creating certain aggregates. These aggregates are undesirable because they are liable to lead to particulate contamination of the substrate, and also to increase the roughness of the thin film [1], [2]. The second type of technique is ALD (atomic layer deposition), in which the reactants (precursors) are introduced in alternation, these phases of reactant introduction being separated by phases of purging with an inert gas, such as dinitrogen $N_2$. The adsorption reaction between a precursor and the substrate takes place in a second phase. The principle behind an ALD deposition cycle is schematically illustrated in FIG. 1. The reaction is said to be self saturating because the precursor does not react with itself in the gas phase. Since the precursors are injected in alternation, gas-phase reactions between the precursors are inhibited, thereby limiting the formation of aggregates and preventing the formation of defects in the thin films, these defects usually being called pinholes. If it is assumed that this inhibition effect is enhanced when deposition is carried out at low temperatures, the ALD technique turns out to be by far the most suitable technology for encapsulation of organic devices because, intrinsically, it creates little particulate contamination in comparison with the PECVD technique, and, furthermore, it allows completely conformal depositions to be produced.

Nevertheless, the inventor has observed that particles are still generated and that therefore there is a residual particle density in reactors used to carry out ALD processing. The graph illustrated in FIG. 2 shows the results of a particulate contamination test as a function of time, as measured by the inventor in a cleanroom for an ALD reactor used to deposit an $Al_2O_3$ encapsulation film on an OLED substrate. More exactly, the reactor was that sold by Cambridge NanoTech under the trade name Savannah. The measurement apparatus used was the surface defect detector sold by Kla-Tencor Corporation, Tencor Instruments under the trademark Surfscan®. The graph shows the inevitable presence of particles. At the present time, in practice, measures are taken in order to limit the density level, i.e. to below a preset threshold S in the number of particles per $cm^2$ (Nd): typically S is chosen to be lower than $300/cm^2$ as illustrated in FIG. 2. Such a threshold must be set because, as indicated above, particles are disadvantageous when it is desired to deposit defect-free oxide barrier films. The peaks in particle density seen in FIG. 2 thus correspond to periods in the operation of the ALD reactor immediately before its maintenance: in fact, chaotic creation of particles in the reactor after many processing cycles is inevitable because deposits produced on the walls bounding the reaction chamber delaminate when the thicknesses of said deposits become too great. Thus complete and regular maintenance of ALD reactors proves to be necessary. This maintenance is elaborate and expensive, because it involves a complete clean of the machine in which the reactor is incorporated, especially via sandblasting and chemical etching operations.

The general aim of the invention is to overcome at least some of the drawbacks of the prior art and therefore to provide a solution that allows the density of residual particles liable to reach a substrate on which it is desired to produce an ALD film to be reduced or even eliminated.

SUMMARY OF THE INVENTION

For this purpose, one subject of the invention is a reactor for atomic layer deposition (ALD), comprising:
  a reaction chamber comprising a platen designed to hold a substrate, and being bounded internally by an upper surface, a lower surface and a lateral surface between the upper surface and the lower surface;
  at least one inlet orifice emerging from one of the surfaces bounding the chamber, and through which at least one gaseous precursor may be injected directly into the reaction chamber; and
  at least one outlet orifice emerging from one of the surfaces bounding the chamber, and through which gaseous species or particles present in the reaction chamber can be evacuated.

According to the invention, the reaction chamber furthermore comprises, within it, at least one wall apertured with at least one orifice, the apertured wall extending around the platen and over at least half the height between the lower surface and the upper surface, at least one orifice in at least one of the apertured walls not facing the inlet orifice so as to form chicanes in the flow of gaseous precursor from each inlet orifice to the platen.

The expression "one orifice in at least one of the apertured walls not facing the inlet orifice" is understood to mean that, if a space (slice of pie) is considered the sides of which originate at the centre of the platen and run tangential to the inlet orifice, the aperture in the wall is not located in this space.

According to one advantageous embodiment, the reaction chamber may comprise, within it, a plurality of walls each apertured with at least one orifice, the plurality of apertured walls extending around the platen and over at least most of the height between the lower surface and the upper surface, one orifice in one apertured wall not facing an orifice in an adjacent apertured wall so as to form chicanes in the flow of gaseous precursor from each inlet orifice to the platen.

The term "platen" is understood to mean the part of the reaction chamber dedicated to positioning/holding the substrate on which it is desired to produce an atomic layer deposition.

The expression "most of the height" is understood to mean a dimension greater than at least 50% of the distance separating the lower and upper surfaces along the longitudinal axis of the chamber, i.e. in its height direction, and advantageously at least 75%, even 90%. It goes without saying that the height of an apertured wall according to the invention could be equal to 100% of the distance separating the lower and upper surfaces. The height of one apertured wall may be less than 100% of the chamber height and then, advantageously, a seal may be added to make up the difference. Thus, when the upper surface of the reaction chamber is removable, forming a cover, a seal may be provided securely fastened to the lid, which seal aligns with the apertured walls when the chamber is closed by positioning the lid. When the height of an apertured wall is not equal to 100% of the chamber height, care is taken that the orifice in the apertured wall is a distance away from the inlet orifice. Thus, for example, if the inlet orifice is located in the lower surface or at the bottom of the lateral surface of the reaction chamber, the orifice in the wall is preferably located near the top of the wall, and vice versa.

An apertured wall according to the invention may advantageously be made of aluminium or stainless steel (stainless). Throughout this Application, the terms "inlet" and "outlet" are used with reference, respectively, to the injection into the chamber of the gaseous precursors (reactants) used to deposit the ALD film, and to the pumping out (suction) of gaseous precursors not adsorbed by the substrate and/or particles present in the reaction chamber.

The chamber may have a plurality of inlet and outlet orifices distributed around all or part of the perimeter of the chamber.

The terms "upper", "lower" and "lateral" are used with reference to the horizontal installed configuration of the reaction chamber, i.e. with the platen arranged horizontally.

According to one advantageous embodiment, the inlet orifice and the outlet orifice are formed in the lower surface and placed on either side of the centre of the platen. In this case the aperture in the wall is advantageously located closer to the inlet orifice(s), substantially perpendicular (±15°) to the axis joining the inlet orifice and the outlet orifice.

According to a preferred embodiment, the walls have a generally cylindrical shape and are arranged around the platen concentrically relative to one another.

Advantageously, each apertured wall is drilled with two diametrically opposed orifices, each orifice of a wall being arranged at an angle of 90° to an orifice in an adjacent apertured wall, about the axis of the cylinders.

According to one variant, the one or more orifices in the one or more apertured walls are one or more holes of circular cross section. The orifices may also take the form of slits, preferably elongate in the height direction of the apertured walls, i.e. slits elongate from the lower surface towards the upper surface. These slits may for example be less than 1 cm in width and may preferably be between 3 and 7 mm in width, even advantageously less than 5 mm in width, and may even preferably be between 3 and 5 mm in width.

According to another advantageous embodiment, the apertured wall closest to the inlet and outlet orifices is apertured with two orifices, one of which is arranged near the inlet orifice and the other of which is arranged near the outlet orifice.

Another subject of the invention is a process for producing a thin film on a substrate by atomic layer deposition (ALD), in which the following steps are carried out:

a) a substrate is positioned on the platen of a reaction chamber bounded internally by an upper surface, a lower surface and a lateral surface between the lower surface and the upper surface, said chamber furthermore comprising, within it, at least one wall apertured with at least one orifice, at least one apertured wall extending around the platen and over at least most of the height between the lower surface and the upper surface, at least one orifice in at least one of the apertured walls not facing the inlet orifice;

b) closing the outlet orifice emerging from one of the surfaces bounding the chamber, and through which gaseous species or particles present in the reaction chamber may be evacuated;

c) injecting a first gaseous precursor of the thin film through an inlet orifice emerging from one of the surfaces bounding the chamber while keeping the closed outlet orifice shut over a first period of time;

d) stopping the injection and opening the outlet orifice and pumping down the chamber through it; steps b) to d) being repeated but with a second thin-film precursor over a second period of time.

Advantageously, in step a), the substrate is positioned with the surface on which the thin film is to be produced directed downwards. It is thus possible to further reduce the number of particles on the surface of the substrate originating from the lid.

According to a variant, the first and second gaseous precursors are injected via the same inlet orifice.

The process of the invention may advantageously be used to produce a thin $Al_2O_3$ film on a substrate by atomic layer deposition (ALD), such as described above, with the first precursor consisting of trimethylaluminium (TMA) and the second precursor consisting of water vapour.

Lastly, the invention relates to application of the process just described to encapsulation of devices containing organic light-emitting diodes (OLEDs). In particular the encapsulation layer of the OLED device may advantageously consist of a transparent $Al_2O_3$ film that is perfectly conformal with the substrate.

Thus, according to the invention, the chicanes in the flow of gaseous precursors prevent residual particles from reaching directly the surface of the substrate on which it is desired to deposit the thin film. In other words, the chicanes form as it were an obstacle defining a winding path for the gaseous precursors and thus modify their course relative to a prior-art architecture in which the gaseous precursors are made to flow in permanence by transverse pumping and directly onto the substrate from the inlet orifice toward the outlet orifice during the deposition cycle. In yet other words, the winding path of the gaseous precursors created by the chicanes especially prevents particles from being sprayed directly onto the surface of the substrate. Particulate contamination of the substrates is prevented or at the very least considerably reduced.

To prevent any non-uniformity in the deposition of the thin film on the surface of the substrate, in the process according to the invention the outlet orifice is blocked before a gaseous precursor is injected. By virtue of this measure, the entire reaction chamber is exposed to gaseous precursors but the deposition flow is not disturbed because strictly speaking there is no flow due to the outlet orifice being blocked. Therefore, all the chamber surfaces and the exposed surface of the substrate are certain to be exposed to reactive precursors. In other words, the gaseous precursors are certain to diffuse into any asperities on the substrate, without the latter being contaminated with particles.

DETAILED DESCRIPTION

Figure 1:
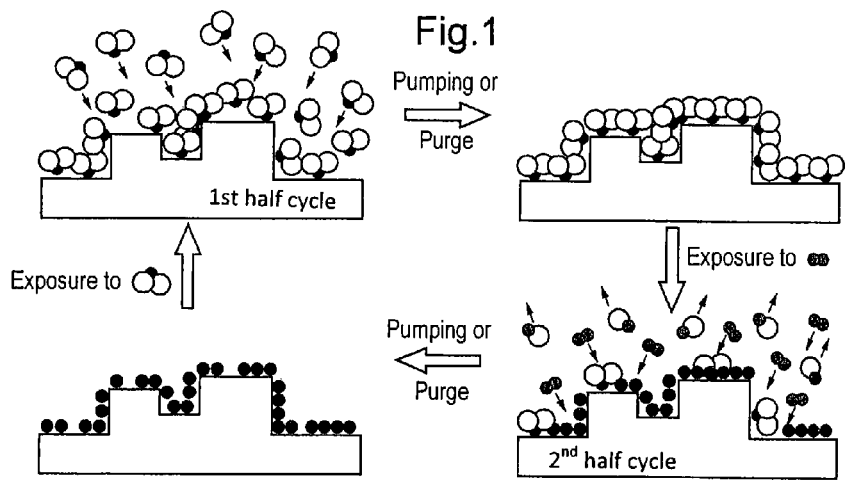
FIG. 1 is a schematic view showing the principal of an ALD reaction cycle.
Figure 2:
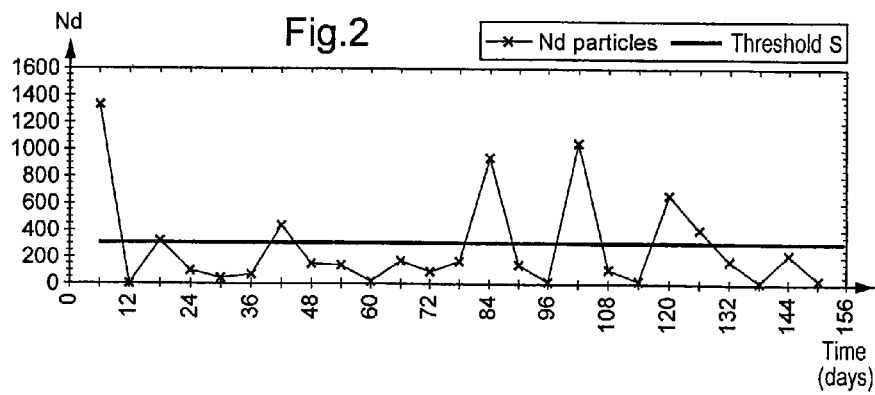
FIG. 2 is a graph of measurements of particle density, in units of number per $cm^2$, as a function of time, in a reactor implementing the prior art ALD technique.

Other advantages and features of the invention will become apparent on reading the detailed description of the invention given by way of nonlimiting illustration and with reference to the following figures in which:

FIGS. 1 and 2 have already been commented upon above in the preamble. They are therefore not described in greater detail here.

Figure 3B:
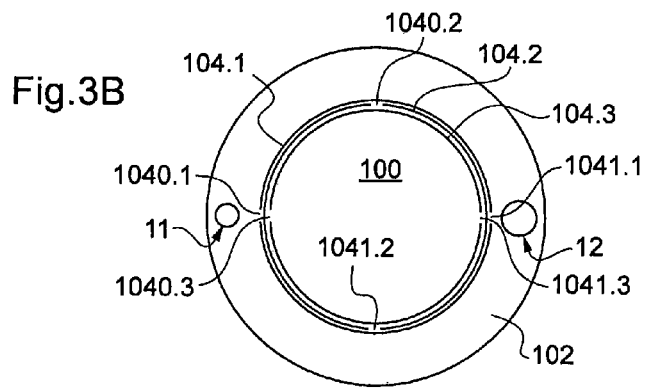
FIG. 3B is a top view of the ALD reactor according to the invention.
Figure 3A:
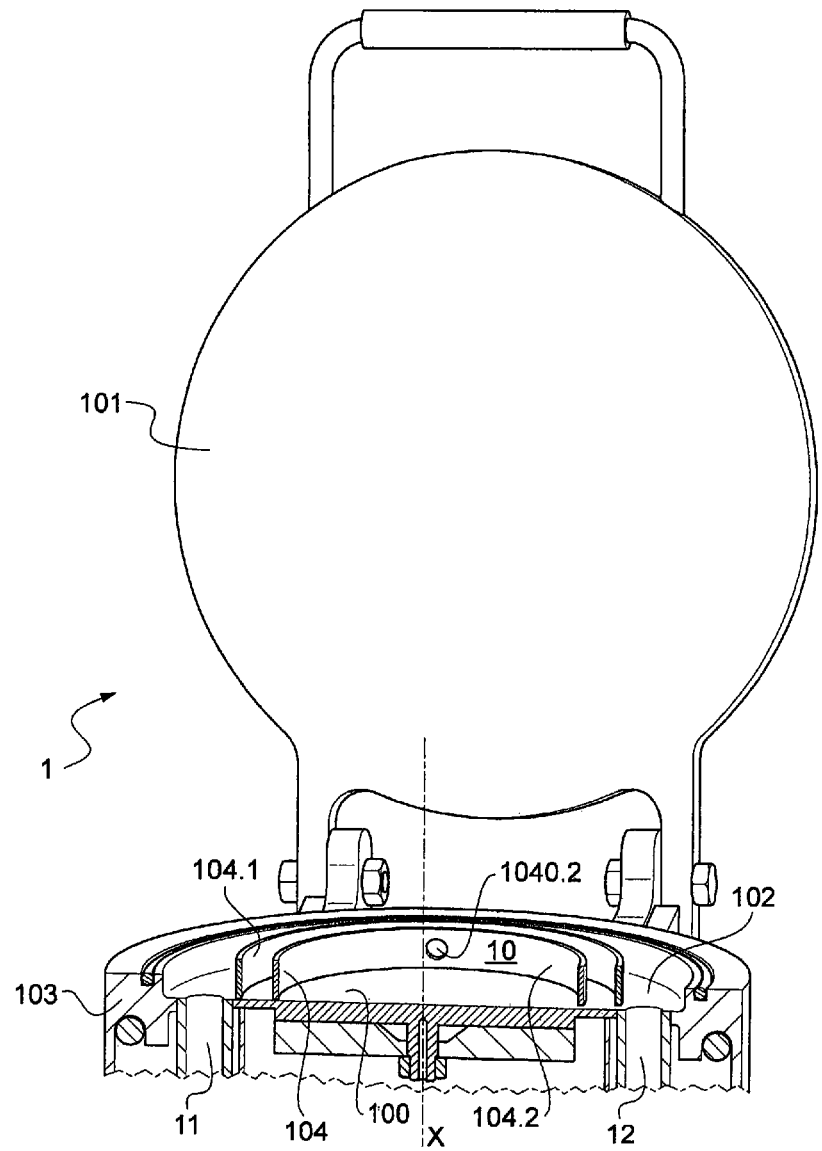
FIG. 3A is a perspective view of an embodiment of a reaction chamber of an ALD reactor according to the invention.

FIGS. 3A and 3B show an ALD reactor 1 according to the invention. For the sake of clarity, only two apertured walls 104.1, 104.2 according to the invention have been shown in FIG. 3A.

The ALD reactor 1 according to the invention comprises a reaction chamber 10 having a generally cylindrical shape about its longitudinal X-axis, this reaction chamber comprising a platen 100 and being bounded by a lid 101 that forms the upper surface, a base 102 that forms the lower surface and a sidewall 103 having a generally annular shape. As shown in the open position in FIG. 3A, the lid 101 opens by pivoting about a horizontal axis and thus allows a substrate (not shown), on which it is desired to carry out an ALD deposition, to be positioned directly on the platen 100.

The base 102 is drilled with a single inlet orifice 11.

To prevent or at the very least reduce particulate contamination of the substrate, according to the invention a plurality of cylindrical walls 104.1, 104.2, 104.3 apertured with two orifices 1040.1, 1041.1; 1040.2, 1041.2; 1040.3, 1041.3, respectively, and arranged concentrically one relative to the other around the platen 100, are provided with one orifice in an apertured wall not facing an adjacent apertured wall.

More precisely, as is better illustrated in FIG. 3B, the two orifices 1040.1, 1041.1; 1040.2, 1041.2; 1040.3, 1041.3 in each apertured wall 104.1, 104.2, 104.3, respectively, are produced in diametrically opposed locations and each is shifted angularly from an orifice in an adjacent wall by an angle of 45° about the longitudinal X-axis.

The external wall 104.1, i.e. the wall closest to the inlet and outlet orifices 11, 12, has one orifice 1040.1 arranged near the inlet orifice 11, the other 1041.1 being arranged near the outlet orifice 12.

Thus, by virtue of the apertured walls 104.1, 104.2, 104.3, chicanes are formed, or in other words a winding path for the gaseous precursors inside the reaction chamber 1.

To prevent any nonuniformity in the film deposited on the surface of the substrate (wafer), the following systematic method is used:

a) the substrate is positioned on the platen 100 of the reaction chamber 10;
b) the outlet orifice 12 is blocked;
c) a first gaseous precursor of the thin film is injected through the inlet orifice 11;
d) the injection is stopped; and
e) the outlet orifice 12 is opened and the chamber is pumped down through it.

In the context of the invention, the time between the stopping of the injection in step d) and the opening in step e) may vary in order to bathe the substrate (wafer) in the precursor atmosphere. Typically, this time may vary between 0.1 seconds and several tens of seconds. Next, exactly the same steps b) to e) are repeated but with a second precursor of the thin film during a second period of time.

In step a), the substrate (wafer) may advantageously be positioned with the surface of the substrate on which it is desired to produce the thin film directed downwards: the substrate may thus be rested only on three supporting pins that are typically equidistant and at an angle of 120° to each other. The supporting pins are preferably small in height, typically rising 5 mm from the platen. This also makes it possible to reduce the number of particles that may fall from the lid onto the surface of the substrate.

The outlet orifice 12 may be blocked directly or indirectly by closing a valve present in a downstream pumping line connected to the outlet orifice. Typically, in a prior-art ALD reactor, this valve may already exist. For example, in the reactor sold by Cambridge NanoTech under the trade name Savannah 200, this valve is denoted "Exposure Mode". Thus, by blocking the outlet orifice 12 before a gaseous precursor is injected, all of the reaction chamber 10 and the exposed part of the substrate in the chamber are exposed to the injected gaseous precursor but its flow is not disturbed because there is no flow as such provided the valve remains closed. In other words, by virtue of the chicanes formed by the apertured walls 104.1, 104.2, 104.3 it is ensured that a winding path is created for the gaseous flow of precursors and also for particles, which cannot therefore be sprayed directly onto the surface of the substrate, and by blocking the outlet orifice 12 a uniform thin-film deposition is obtained by diffusion of the gaseous precursors.

Nitrogen $N_2$ is the carrier gas when the valve is reopened to pump the chamber down. The nitrogen $N_2$ also lastly acts to purge the assembly.

The ALD reactor 1 described above may advantageously be used to encapsulate an OLED substrate with a film of $Al_2O_3$ produced from water vapour and trimethylaluminium (TMA).

Other variants and improvements may be envisioned without however departing from the scope of the invention.

Thus, although described in more detail with reference to the reactor 1 with the inlet orifice 11 and the outlet orifice 12 formed on the base 2, the invention may be applied to any known reactor geometry insofar as the chicanes according to the invention can be implanted. Moreover, the invention may be implemented in ALD reactors that already exist, such as that sold by Cambridge NanoTech under the trade name Savannah 200.

Although the reactor 1 according to the invention shown in FIGS. 3A and 3B has three apertured walls 104.1, 104.2, 104.3 it is of course possible to use a larger number in order to further increase the distance the gaseous precursors have to travel before reaching the substrate.

Likewise, although the angle between the orifices in the adjacent walls is equal to 45° for the reactor 1 shown in FIGS.

3A and 3B, it goes without saying that the number of orifices and the angle between the orifices could be different.

Although the orifices in the walls shown are simple circular holes (see hole 1040.2 in FIG. 3A), orifices taking the form of slits, for example of rectangular cross section, may also be envisaged.

The invention may advantageously be applied to any atomic layer deposition encapsulation of a substrate.

The invention is not limited to the examples just described; features of the examples illustrated may especially be combined together in other variants (not shown).

REFERENCES

[1] *"Plasma particulate contamination control-I. Transport and process effects"*, by G. S. Selwyn Journal Vacuum Science Technology, pp 3487-3492, Journal Vacuum Science Technology B 9 (6), November/December 1991;

[2] *"Plasma particulate contamination control. II. Self cleaning tool design"*, by G. S. Selwyn and E. F. Patterson pp 1053-1059 Journal Vacuum Science Technology. A, Vol. 10, No. 4, July/August 1992.

The invention claimed is:

1. A reactor for atomic layer deposition (ALD), comprising:
    an ALD reaction chamber comprising a platen designed to hold a substrate, and being bounded internally by an upper surface, a lower surface and a lateral surface between the upper surface and the lower surface;
    at least one inlet orifice emerging from one of the surfaces bounding the chamber, and through which at least one gaseous precursor may be injected directly into the reaction chamber; and
    at least one outlet orifice emerging from one of the surfaces bounding the chamber, and through which gaseous species or particles present in the reaction chamber can be evacuated during use;
    wherein the reaction chamber comprises, within it, a plurality of walls each apertured with at least one orifice, the plurality of apertured walls extending around the platen and over at least most of the height between the lower surface and the upper surface, and further wherein at least one orifice in one apertured wall does not face an orifice in an adjacent apertured wall so as to form chicanes in the flow of gaseous precursor from each inlet orifice to the platen during use in an ALD process.

2. The reactor according to claim 1, wherein the inlet orifice and the outlet orifice are formed in the lower surface and placed on either side of the centre of the platen.

3. The reactor according to claim 1, wherein the walls have a generally cylindrical shape and are arranged around the platen concentrically relative to one another.

4. The reactor according to claim 1, wherein each apertured wall is drilled with two diametrically opposed orifices, each orifice of a wall being arranged at an angle of 90° to an orifice in an adjacent apertured wall, about the axis of the cylinders.

5. The reactor according to claim 1, wherein the one or more orifices in the one or more apertured walls are one or more slits.

6. The reactor according to claim 1, wherein the one or more orifices in the one or more apertured walls are one or more holes of circular cross section.

7. The reactor according to claim 1, wherein the apertured wall closest to the inlet and outlet orifices is apertured with two orifices, one of which is arranged near the inlet orifice and the other of which is arranged near the outlet orifice.

\* \* \* \* \*